US012683511B2

(12) United States Patent
Ito

(10) Patent No.: US 12,683,511 B2
(45) Date of Patent: Jul. 14, 2026

(54) ELECTRIC DEVICE AND MOVING OBJECT

(71) Applicant: HONDA MOTOR CO., LTD., Tokyo (JP)

(72) Inventor: Shogo Ito, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 184 days.

(21) Appl. No.: 18/595,971

(22) Filed: Mar. 5, 2024

(65) Prior Publication Data

US 2024/0313666 A1 Sep. 19, 2024

(30) Foreign Application Priority Data

Mar. 13, 2023 (JP) ................................. 2023-038329

(51) Int. Cl.
H02M 7/00 (2006.01)
B64C 29/00 (2006.01)
H05K 7/20 (2006.01)

(52) U.S. Cl.
CPC ......... H02M 7/003 (2013.01); B64C 29/0091 (2013.01); H05K 7/20927 (2013.01)

(58) Field of Classification Search
CPC .............. H02M 7/003; B64C 29/0091; H05K 7/20927
See application file for complete search history.

(56) References Cited

U.S. PATENT DOCUMENTS

| | | | | |
|---|---|---|---|---|
| 5,623,399 A * | 4/1997 | Ishii | ................... | H05K 7/14329 |
| | | | | 363/141 |
| 9,184,670 B2 * | 11/2015 | Matsuno | ............... | H02M 7/003 |
| 2003/0001438 A1 * | 1/2003 | Nii | ........................ | H02M 7/003 |
| | | | | 307/147 |
| 2012/0248909 A1 | 10/2012 | Ito et al. | | |
| 2014/0065894 A1 * | 3/2014 | Yamamoto | ............. | H01R 11/09 |
| | | | | 439/877 |
| 2015/0155692 A1 * | 6/2015 | Hwang | .................. | H02G 5/025 |
| | | | | 174/70 B |
| 2016/0163460 A1 * | 6/2016 | Inazumi | ................... | H01G 4/40 |
| | | | | 361/679.01 |
| 2019/0067167 A1 * | 2/2019 | Hong | .................. | H01L 23/4922 |
| 2019/0356234 A1 * | 11/2019 | Yamaura | ................. | H02M 7/48 |
| 2020/0115045 A1 | 4/2020 | Mermoz et al. | | |

FOREIGN PATENT DOCUMENTS

JP 5534353 B2 6/2014

* cited by examiner

*Primary Examiner* — Gary L Laxton
(74) *Attorney, Agent, or Firm* — Rankin, Hill & Clark LLP

(57) ABSTRACT

A power control unit includes power modules, and a positive bus bar connected to positive connection terminals disposed on connection surfaces provided on the power modules. The positive bus bar includes power module connection portions connected to the respective positive connection terminals and extending in the X direction, and standing portions extending along the power module connection portions and standing from the respective power module connection portions.

11 Claims, 16 Drawing Sheets

ELECTRIC DEVICE AND MOVING OBJECT

CROSS-REFERENCE TO RELATED APPLICATIONS

This application is based upon and claims the benefit of priority from Japanese Patent Application No. 2023-038329 filed on Mar. 13, 2023, the contents of which are incorporated herein by reference.

BACKGROUND OF THE INVENTION

Field of the Invention

The present invention relates to an electric device and a moving object.

Description of the Related Art

JP 5534353 B2 discloses an inverter device (electric device). The inverter device includes bus bars therein.

SUMMARY OF THE INVENTION

Recently, there is a demand for an electric device with a small energy loss.

An object of the present invention is to solve the above-mentioned problem.

According to a first aspect of the present invention, there is provided an electric device comprising: an electric component; and a first bus bar connected to a first connection terminal disposed on a connection surface provided on the electric component, wherein the first bus bar includes a first connection portion connected to the first connection terminal and extending in a first direction, and a first standing portion extending along the first connection portion and standing from the first connection portion.

According to a second aspect of the present invention, there is provided a moving object comprising the electric device according to the first aspect.

According to the present invention, it is possible to provide an electric device with a small energy loss.

The above and other objects, features, and advantages of the present invention will become more apparent from the following description when taken in conjunction with the accompanying drawings, in which a preferred embodiment of the present invention is shown by way of illustrative example.

DETAILED DESCRIPTION OF THE INVENTION

Embodiment

An electric device 10 according to an embodiment will be described with reference to the drawings. In the present embodiment, a case where the electric device 10 is a power control unit will be described as an example, but the present invention is not limited thereto. The power control unit 10 is mounted on a moving object 12. In the present embodiment, a case where the moving object 12 is an aircraft will be described as an example, but the present invention is not limited thereto.

[Configuration of Aircraft]

Figure 1:
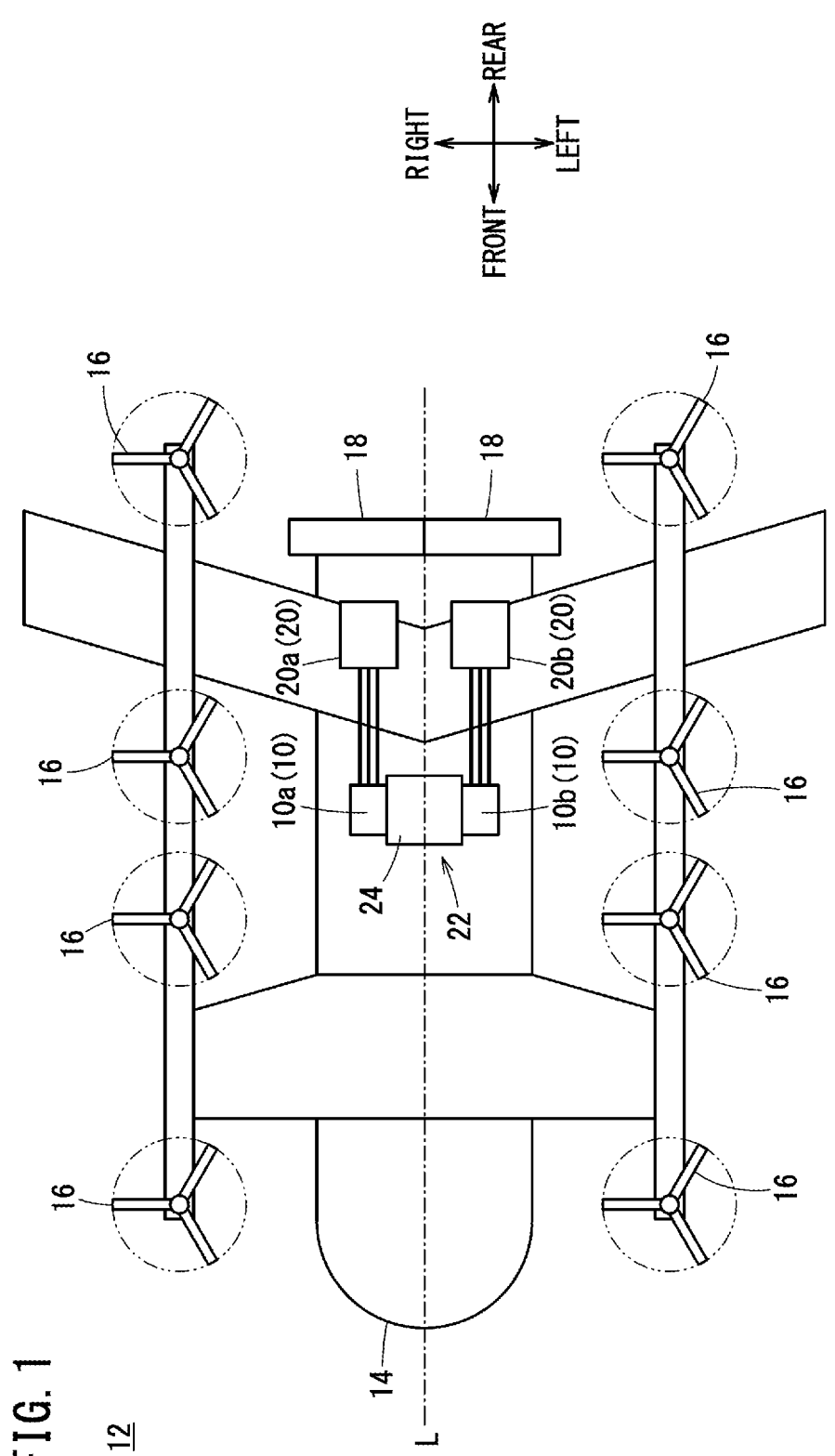
FIG. 1 is a schematic view of a moving object.

FIG. 1 is a schematic view of an aircraft 12. The aircraft 12 of the present embodiment is an electric vertical take-off and landing aircraft (eVTOL aircraft). In the aircraft 12, rotors are driven by electric motors. The aircraft 12 generates thrust in the vertical direction and thrust in the horizontal direction by the rotors.

The aircraft 12 includes a fuselage 14. The aircraft 12 includes eight VTOL rotors 16. The VTOL rotors 16 generate upward thrust for the fuselage 14. The aircraft 12 includes two cruise rotors 18. The cruise rotors 18 generate forward thrust for the fuselage 14.

The VTOL rotors 16 and the cruise rotors 18 are each driven by an electric motor (not shown). The aircraft 12 includes a generator 20 and a battery (not shown) as power sources of the electric motor. Electric power supplied by the generator 20 is supplied to the electric motor. When the electric power generated by the generator 20 is insufficient with respect to the required electric power, electric power stored in the battery is supplied to the electric motor.

[Configuration of Power Supply Device]

The aircraft 12 includes a power supply device 22. The power supply device 22 includes generators 20, power control units 10, and a main junction box 24. Hereinafter, the power control unit 10 may be referred to as a PCU 10. Further, the main junction box 24 may be referred to as an MJB 24.

The power supply device 22 includes two generators 20. One of the two generators 20 is a first generator 20a, and the other of the two generators 20 is a second generator 20b. The first generator 20a is disposed on the right side of a center line L in the left-right direction of the fuselage 14 of the aircraft 12, and the second generator 20b is disposed on the left side of the center line L.

The power supply device 22 includes two PCUs 10. One of the two PCUs 10 is a first PCU 10a, and the other of the two PCUs 10 is a second PCU 10b. The MJB 24 is disposed about the center line L of the fuselage 14. The first PCU 10a is attached to a right side surface of the MJB 24, and the second PCU 10b is attached to a left side surface of the MJB 24.

The electric power obtained by power generation by the first generator 20a is supplied to the first PCU 10a. The first PCU 10a converts three-phase AC power supplied from the first generator 20a into DC power. The converted DC power is supplied to the MJB 24.

The electric power obtained by power generation by the second generator 20b is supplied to the second PCU 10b. The second PCU 10b converts three-phase AC power supplied from the second generator 20b into DC power. The converted DC power is supplied to the MJB 24. That is, the PCU 10 is a power conversion device.

Figure 2:
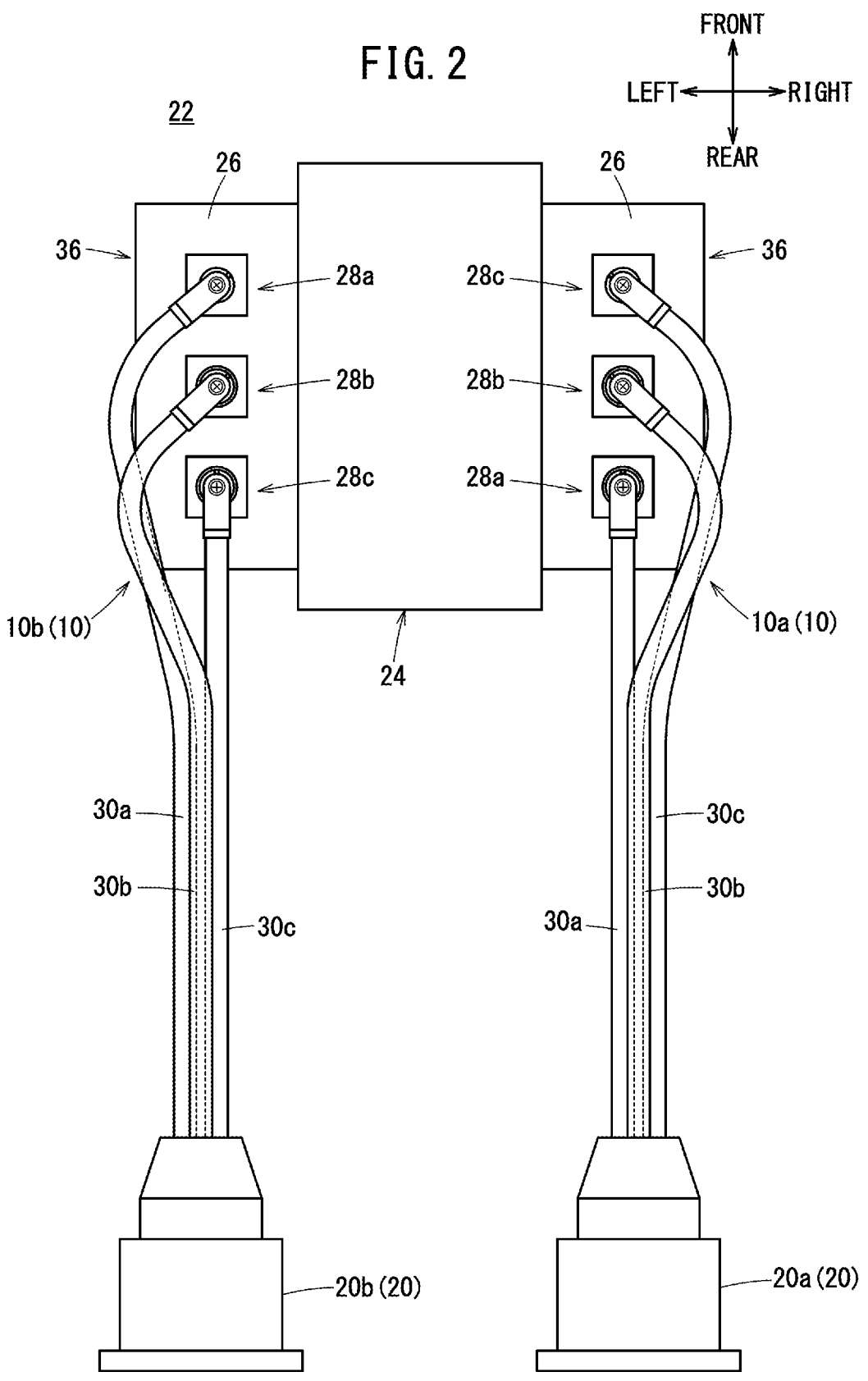
FIG. 2 is a top view of a power supply device.

FIG. 2 is a schematic view of the power supply device 22 as viewed from above. A U-phase terminal 28*a*, a V-phase terminal 28*b*, and a W-phase terminal 28*c* are provided on an upper surface 26 of a casing 36 of each PCU 10.

A U-phase cable 30*a* extending from the generator 20 is connected to the U-phase terminal 28*a* of the PCU 10. A V-phase cable 30*b* extending from the generator 20 is connected to the V-phase terminal 28*b* of the PCU 10. A W-phase cable 30*c* extending from the generator 20 is connected to the W-phase terminal 28*c* of the PCU 10.

Figure 3:
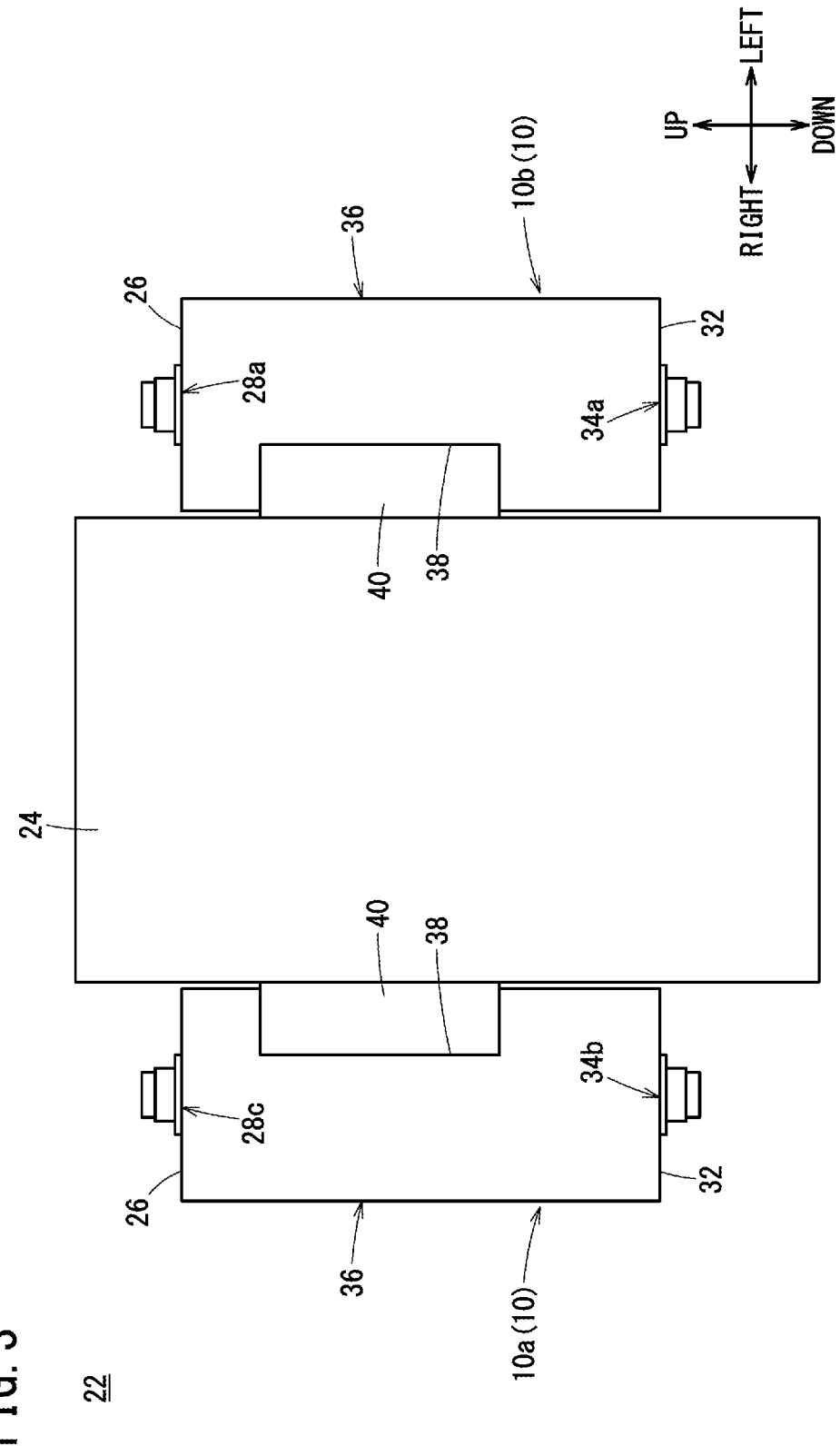
FIG. 3 is a schematic view of the power supply device as viewed from the front of a fuselage.

FIG. 3 is a schematic view of the power supply device 22 as viewed from the front of the fuselage 14. A positive terminal 34*a* and a negative terminal 34*b* are provided on a lower surface 32 of the casing 36 of each PCU 10. FIG. 3 illustrates the negative terminal 34*b* provided on the first PCU 10*a*, and the positive terminal 34*a* provided on the second PCU 10*b*. Cables (not shown) are connected to the positive terminal 34*a* and the negative terminal 34*b*. The PCU 10 and the MJB 24 are connected by the cables.

The casing 36 of the PCU 10 includes an accommodation portion 38. A cooler 40 is accommodated in the accommodation portion 38. Cooling water flows inside the cooler 40. The PCU 10 includes power modules 48 (FIG. 4) including switching elements and the like therein. The power modules 48 generate heat. The power modules 48 are cooled by the cooler 40.

[Configuration of PCU]

Figure 4:
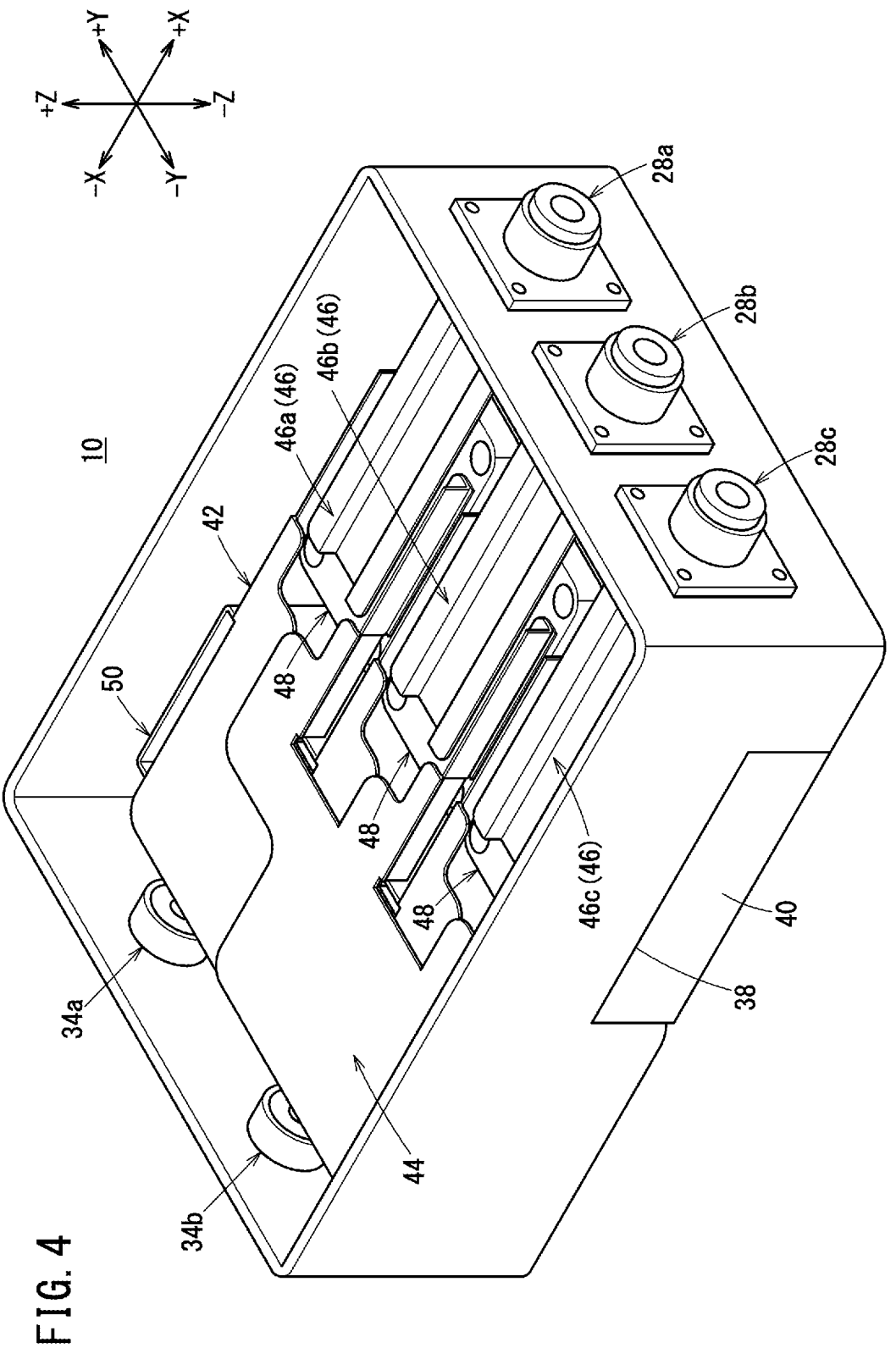
FIG. 4 is a perspective view of an electric device.

FIG. 4 is a perspective view of the PCU 10. FIG. 4 shows a state in which a cover of the casing 36 is removed.

In FIG. 4, arrows indicating an X direction, a Y direction, and a Z direction are shown. The X direction, the Y direction, and the Z direction are orthogonal to each other. Further, one of the X directions is defined as a +X direction, and the other is defined as a −X direction. The same applies to the Y direction and the Z direction. The X direction corresponds to a first direction of the present invention.

The PCU 10 includes a positive bus bar 42, a negative bus bar 44, phase bus bars 46, the power modules 48, and a capacitor 50.

The positive bus bar 42 electrically connects the positive terminal 34*a* and the power module 48. The negative bus bar 44 electrically connects the negative terminal 34*b* and the power module 48. The power module 48 corresponds to an electric component of the present invention. The positive bus bar 42 corresponds to a first bus bar of the present invention.

The PCU 10 includes three phase bus bars 46. Specifically, the PCU 10 includes a U-phase bus bar 46*a*, a V-phase bus bar 46*b*, and a W-phase bus bar 46*c*. The U-phase bus bar 46*a* electrically connects the U-phase terminal 28*a* and the power module 48. The V-phase bus bar 46*b* electrically connects the V-phase terminal 28*b* and the power module 48. The W-phase bus bar 46*c* electrically connects the W-phase terminal 28*c* and the power module 48. The phase bus bar 46 corresponds to a second bus bar of the present invention.

Figure 5:
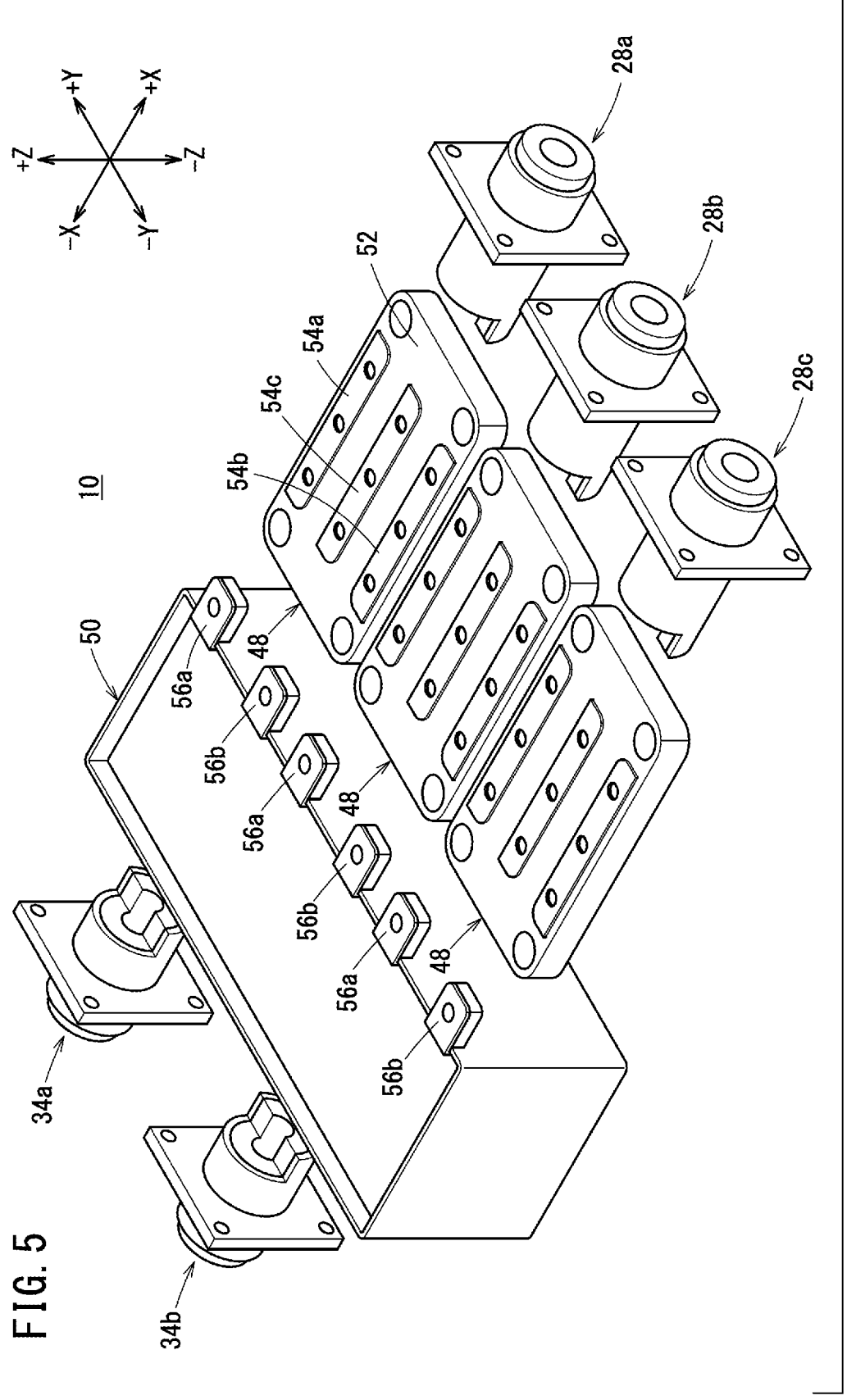
FIG. 5 is a perspective view of the electric device.
Figure 6:
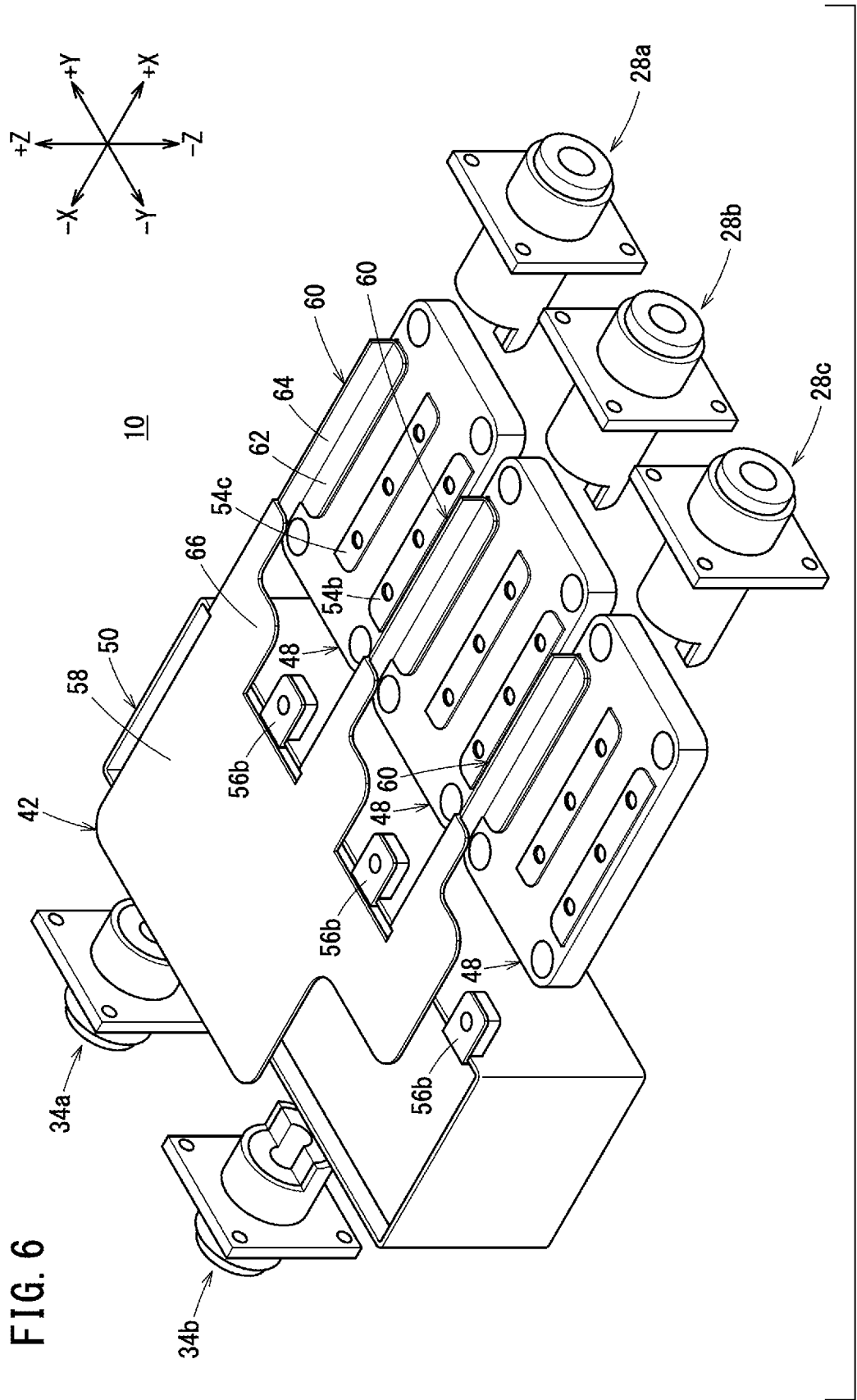
FIG. 6 is a perspective view of the electric device.
Figure 7:
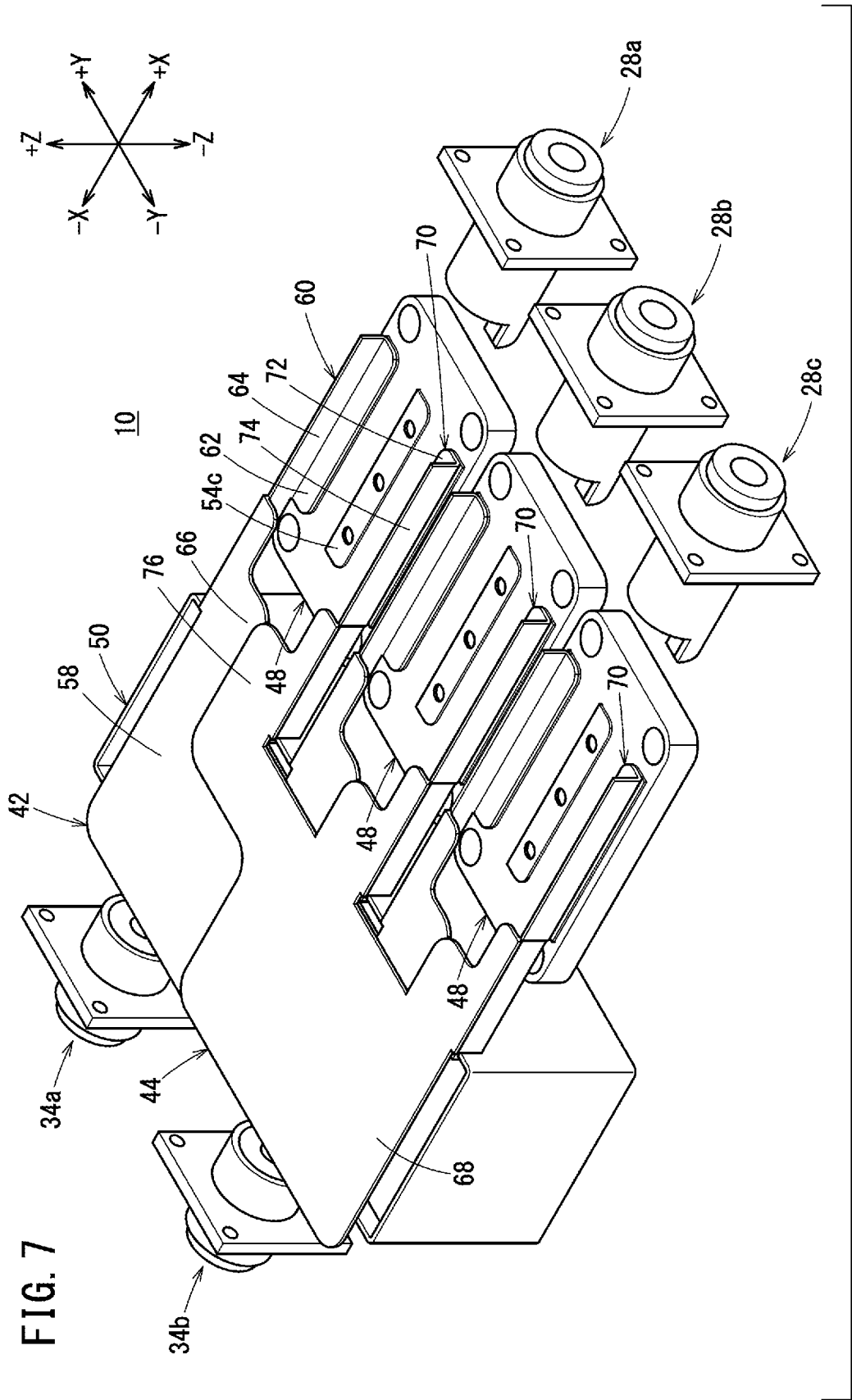
FIG. 7 is a perspective view of the electric device.
Figure 8:
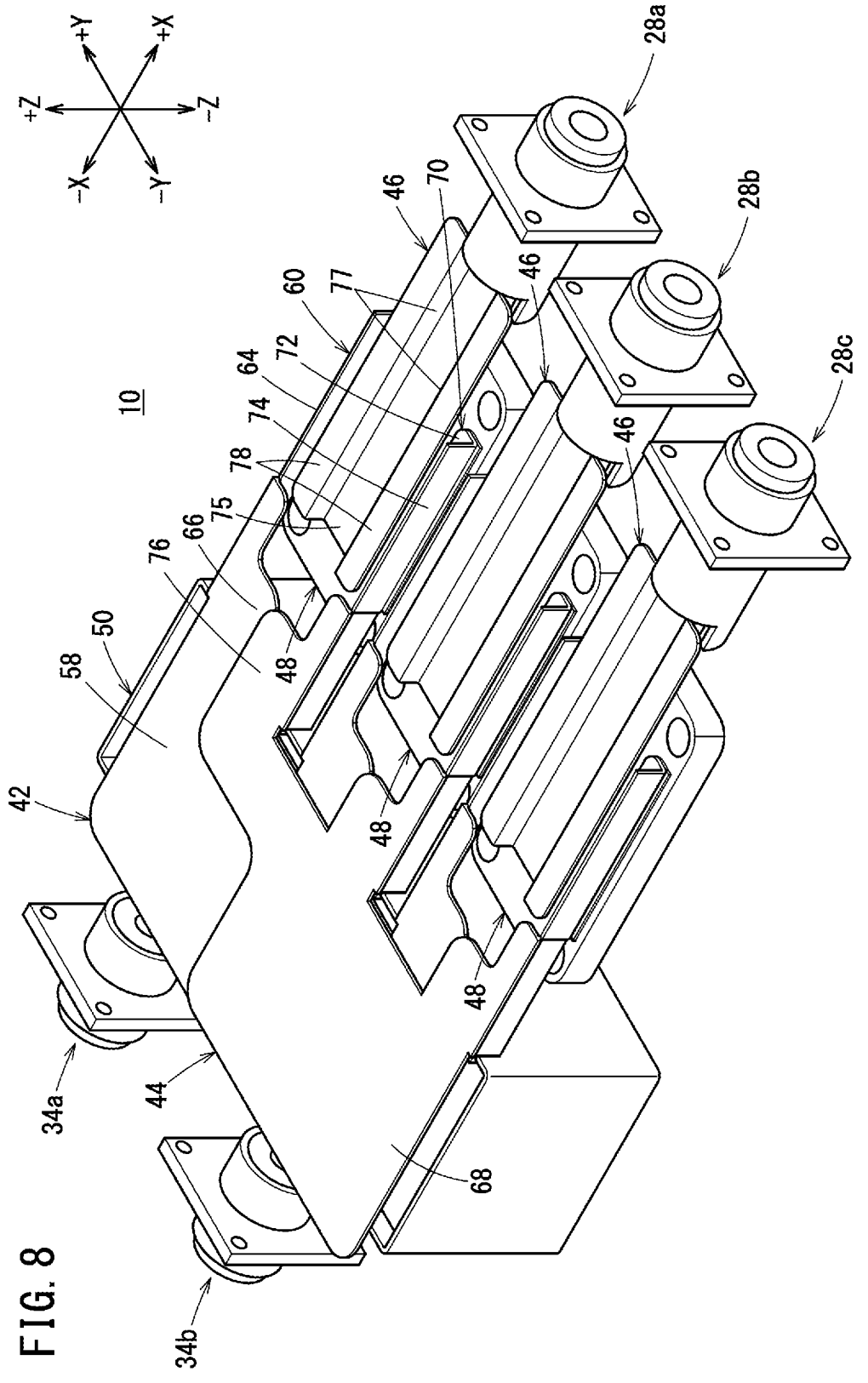
FIG. 8 is a perspective view of the electric device.

FIGS. 5 to 8 are perspective views of the PCU 10. In FIG. 5, the casing 36, the cooler 40, the positive bus bar 42, the negative bus bar 44, and the phase bus bars 46 are not shown. In FIG. 6, the casing 36, the cooler 40, the negative bus bar 44, and the phase bus bars 46 are not shown. In FIG. 7, the casing 36, the cooler 40, and the phase bus bars 46 are not shown. In FIG. 8, the casing 36 and the cooler 40 are not shown.

The PCU includes three power modules 48. The power modules 48 each have a connection surface 52. The connection surface 52 is a surface facing the +Z direction among a plurality of surfaces provided on the power module 48. The connection surface 52 is substantially parallel to the X direction and the Y direction. The connection surface 52 is provided with a positive connection terminal 54*a*, a negative connection terminal 54*b*, and a phase connection terminal 54*c*. The positive connection terminal 54*a* and the phase connection terminal 54*c* are adjacent to each other, and the negative connection terminal 54*b* and the phase connection terminal 54*c* are adjacent to each other. The positive bus bar 42 is connected to the positive connection terminals 54*a*. The negative bus bar 44 is connected to the negative connection terminals 54*b*. The phase bus bars 46 are respectively connected to the phase connection terminals 54*c*. The bus bars are fixed to the connection terminals of the power modules 48 by fastening members such as screws or bolts (not shown).

The power modules 48 each include switching elements and the like therein. The power module 48 rectifies AC electricity of each phase input from the phase bus bar 46, and outputs the rectified electricity to the positive bus bar 42 and the negative bus bar 44.

The capacitor 50 includes positive connection terminals 56*a* and negative connection terminals 56*b*. The capacitor 50 smooths the voltage output from the power modules 48. The positive bus bar 42 is connected to the positive connection terminals 56*a*. The negative bus bar 44 is connected to the negative connection terminals 56*b*. The bus bars are fixed to the connection terminals of the capacitor 50 by fastening members such as screws or bolts (not shown).

Figure 9:
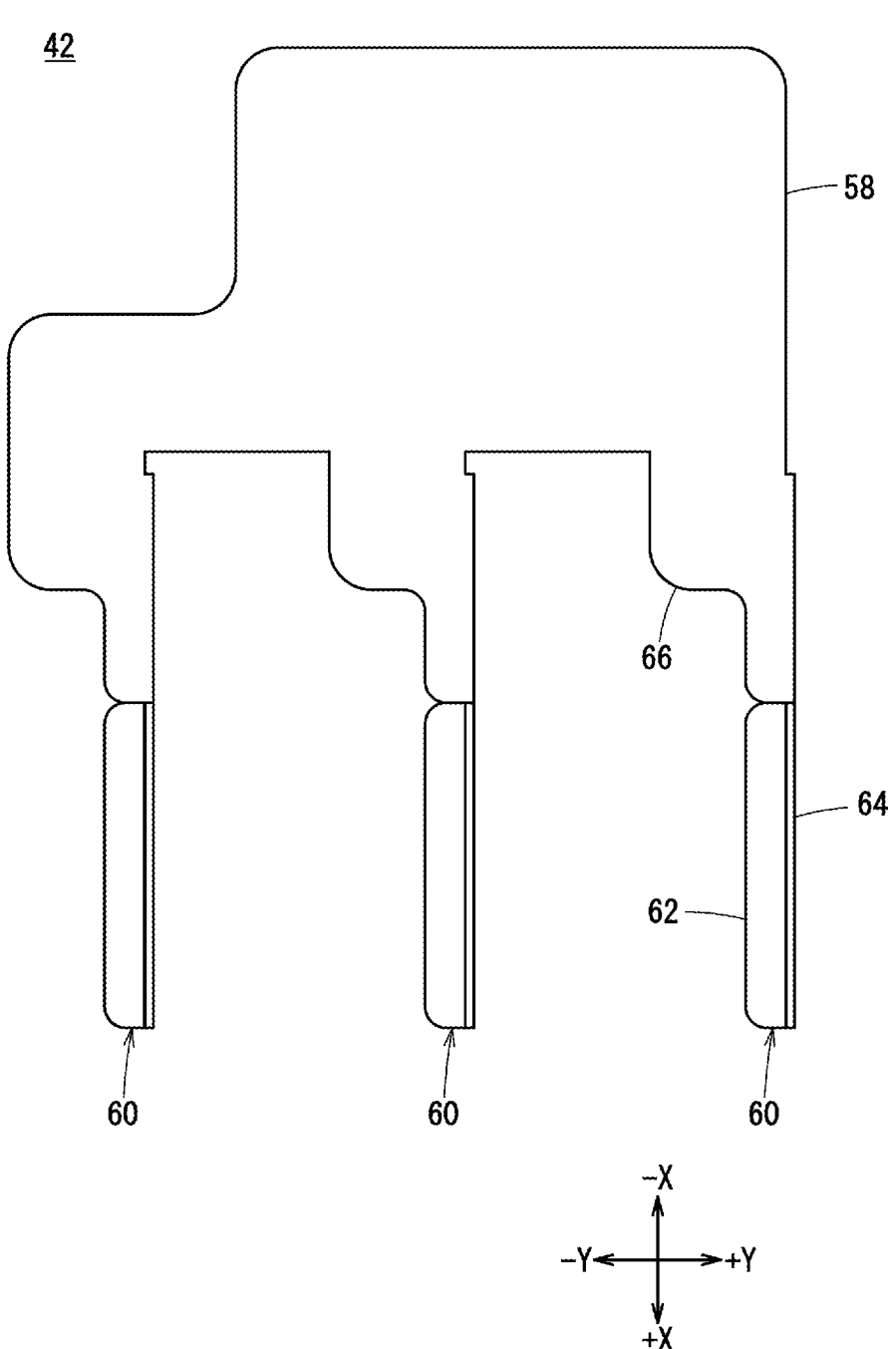
FIG. 9 is a front view of a positive bus bar.
Figure 10:
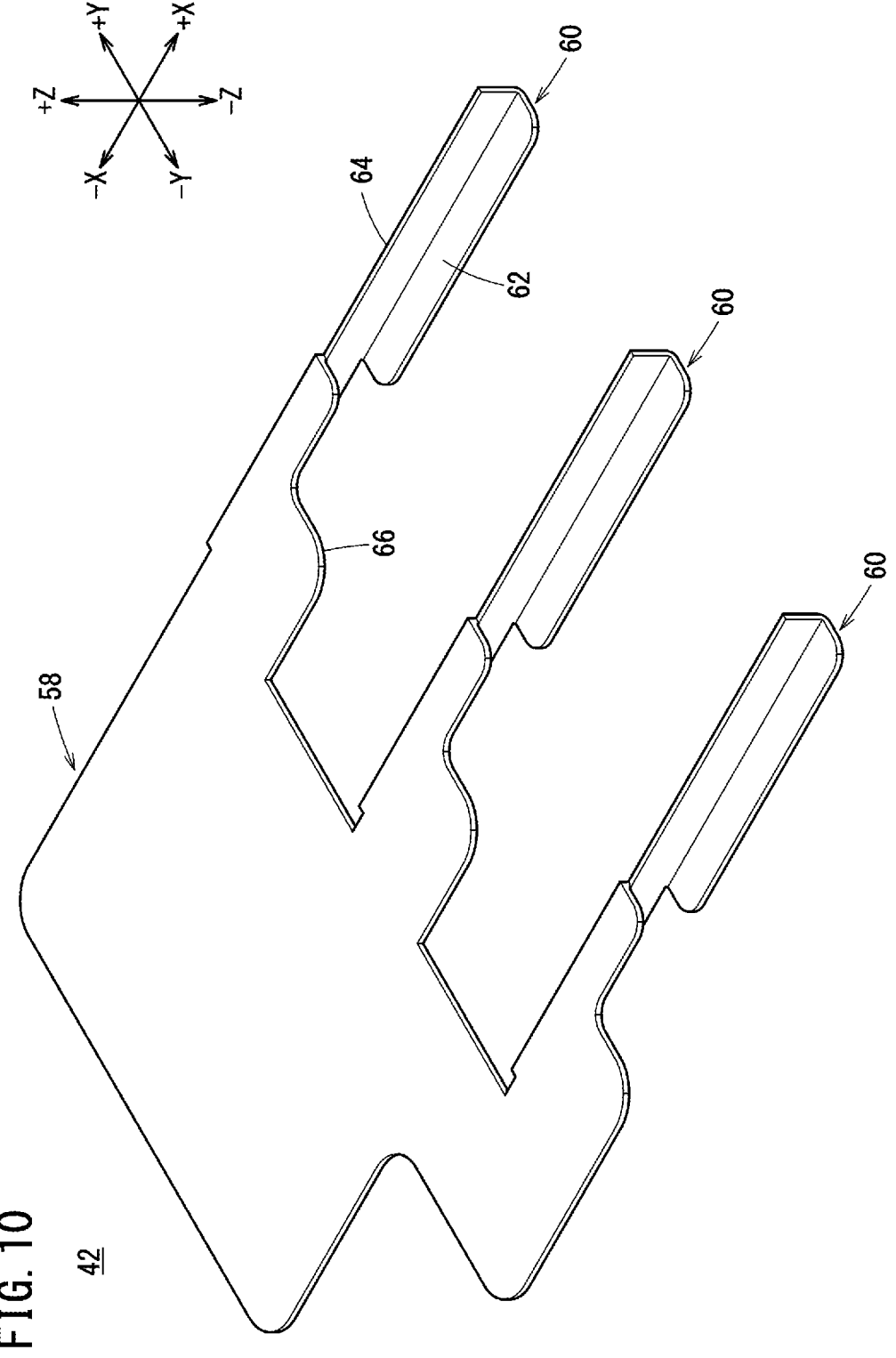
FIG. 10 is a perspective view of the positive bus bar.

FIG. 9 is a front view of the positive bus bar 42. FIG. 10 is a perspective view of the positive bus bar 42. The positive bus bar 42 includes a positive terminal connection portion 58 and three branch portions 60. The branch portions 60 extend in the +X direction from the positive terminal connection portion 58.

A power module connection portion 62 is provided at an end portion of each branch portion 60 on the +X direction side. The power module connection portion 62 extends in the X direction. As shown in FIG. 6, the power module connection portion 62 is connected to the positive connection terminal 54*a* of the power module 48. Each branch portion 60 includes a standing portion 64 standing from the power module connection portion 62 in the +Z direction. The standing portion 64 extends in the X direction. That is, the standing portion 64 extends along the power module connection portion 62. The positive connection terminal 54*a* correspond to a first connection terminal of the present invention. The power module connection portion 62 corresponds to a first connection portion of the present invention. The standing portion 64 corresponds to a first standing portion of the present invention.

A capacitor connection portion 66 is provided at an end portion of each branch portion 60 on the −X direction side. The capacitor connection portion 66 protrudes from the standing portion 64 in the −Y direction. The positive terminal connection portion 58 is connected to an end portion of the capacitor connection portion 66 on the −X direction side. The capacitor connection portion 66 is connected to the positive connection terminal 56*a* of the capacitor 50.

The positive terminal connection portion 58 is formed wider than each branch portion 60. An end portion of the positive terminal connection portion 58 on the −X direction side is connected to the positive terminal 34*a*.

Figure 11:
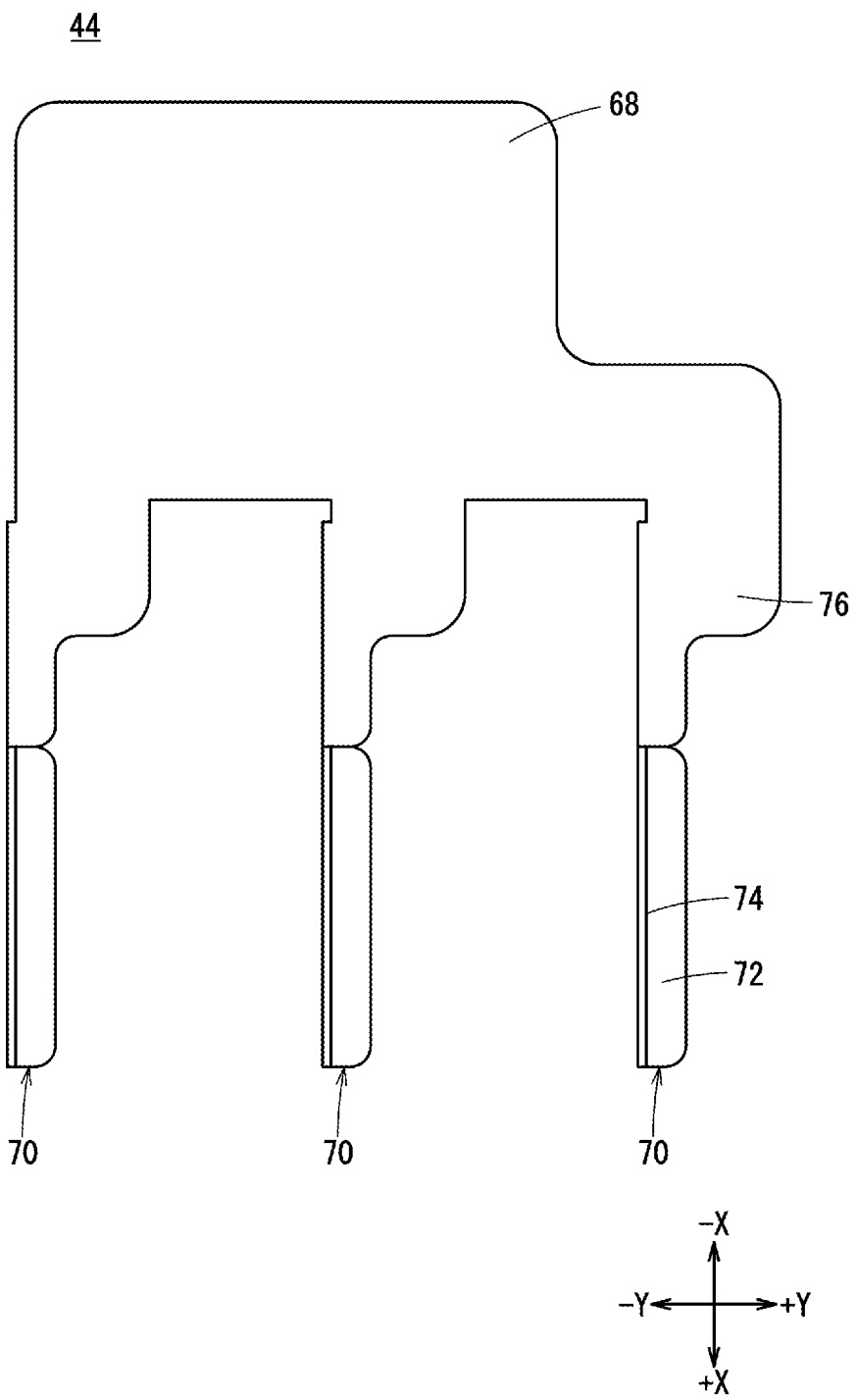
FIG. 11 is a plan view of a negative bus bar.
Figure 12:
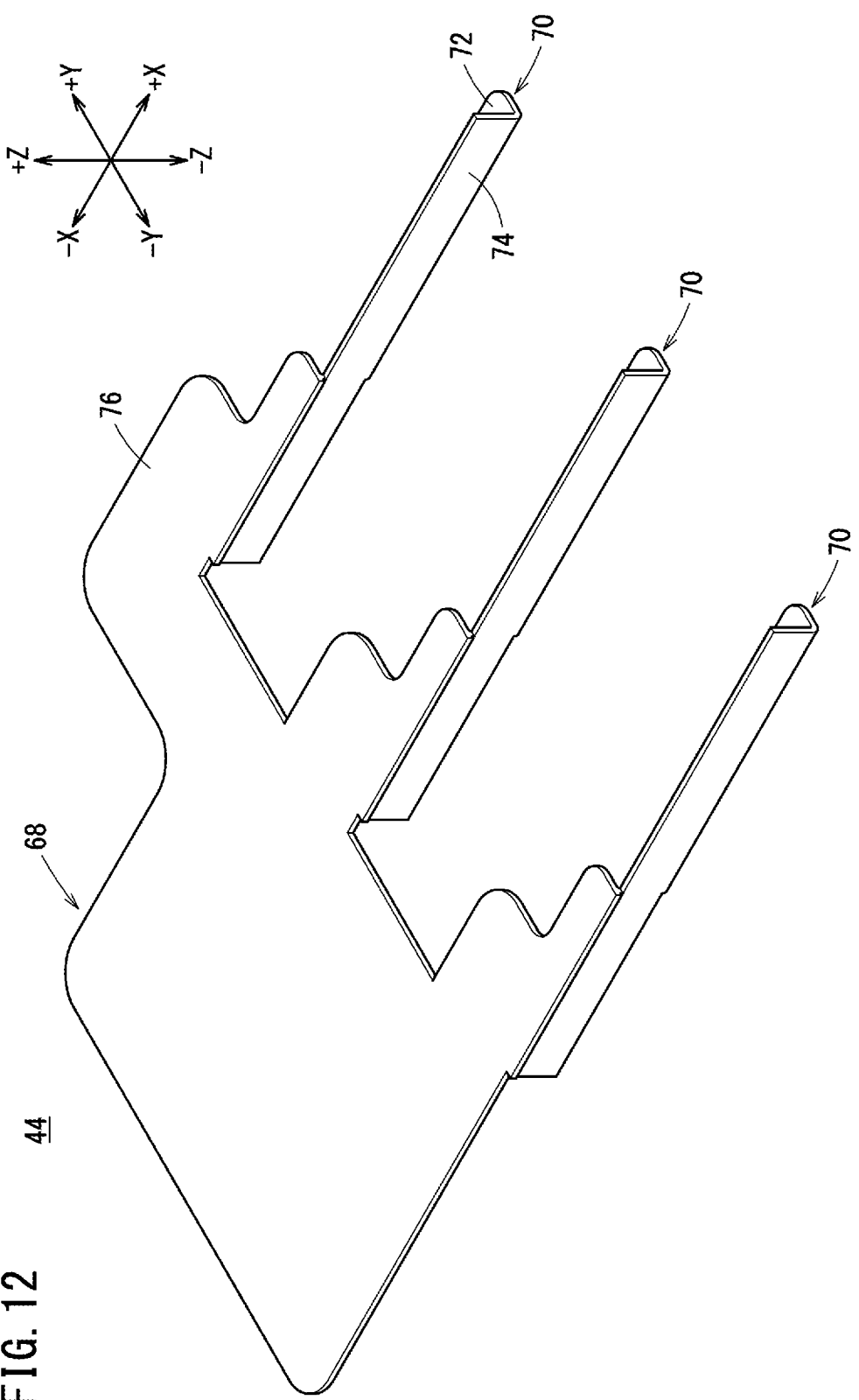
FIG. 12 is a perspective view of the negative bus bar.

FIG. 11 is a plan view of the negative bus bar 44. FIG. 12 is a perspective view of the negative bus bar 44. The negative bus bar 44 includes a negative terminal connection portion 68 and three branch portions 70. The branch portions 70 extend in the +X direction from the negative terminal connection portion 68.

A power module connection portion 72 is provided at an end portion of each branch portion 70 on the +X direction side. The power module connection portion 72 extends in the X direction. As shown in FIG. 7, the power module connection portion 72 is connected to the negative connection terminal 54b of the power module 48. Each branch portion 70 includes a standing portion 74 standing from the power module connection portion 72 in the +Z direction. The standing portion 74 extends along the power module connection portion 72. That is, the standing portion 74 extends in the X direction.

A capacitor connection portion 76 is provided at an end portion of each branch portion 70 on the −X direction side. The capacitor connection portion 76 protrudes from the standing portion 74 in the +Y direction. The negative terminal connection portion 68 is connected to an end portion of the capacitor connection portion 76 on the −X direction side. The capacitor connection portion 76 is connected to the negative connection terminal 56b of the capacitor 50.

The negative terminal connection portion 68 is formed wider than each branch portion 70. An end portion of the negative terminal connection portion 68 on the −X direction side is connected to the negative terminal 34b.

Figure 13:
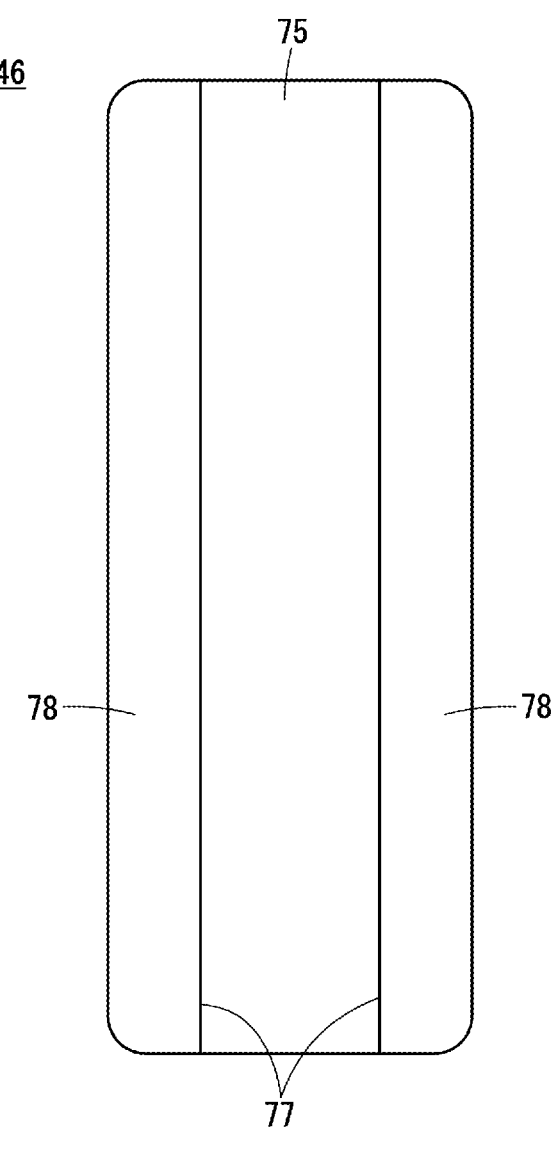
FIG. 13 is a plan view of a phase bus bar.
Figure 13:
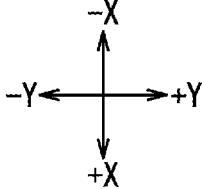
Figure 14:
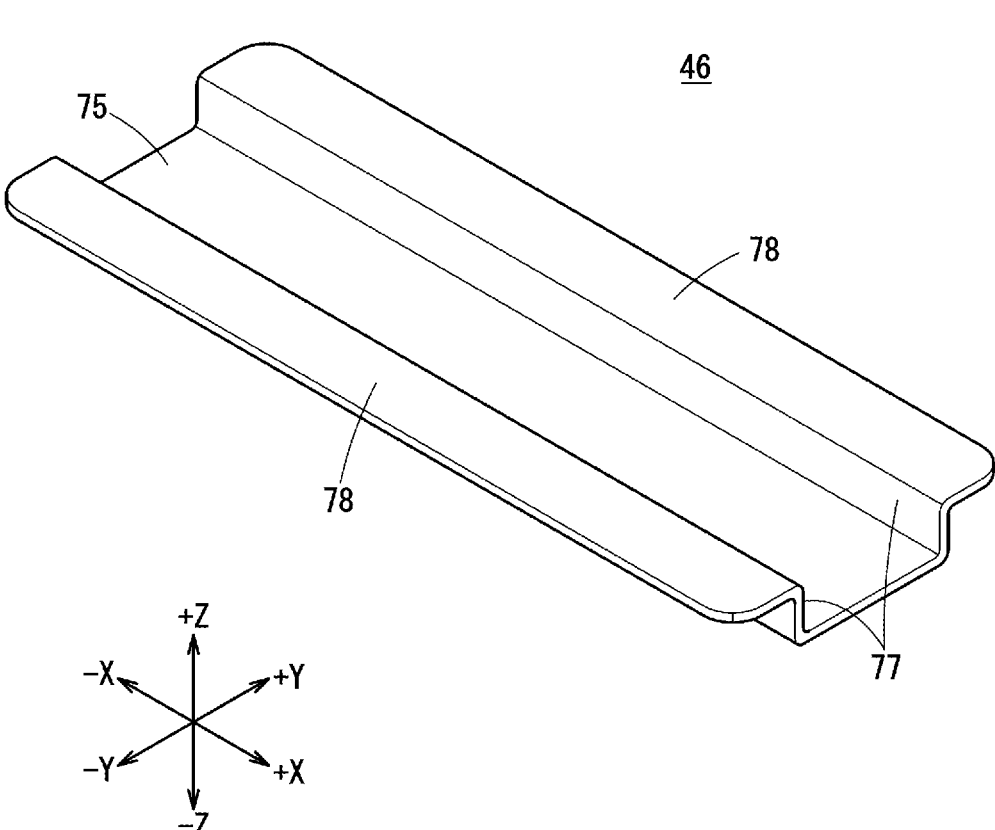
FIG. 14 is a perspective view of the phase bus bar.

FIG. 13 is a plan view of the phase bus bar 46. FIG. 14 is a perspective view of the phase bus bar 46. Each phase bus bar 46 includes a connection portion 75, standing portions 77, and protruding portions 78. The connection portion 75 extends in the X direction. As shown in FIG. 8, end portions of the connection portions 75 on the +X direction side are respectively connected to the phase terminals 28 (the U-phase terminal 28a, the V-phase terminal 28b, and the W-phase terminal 28c). In addition, a portion of each connection portion 75 on the −X direction side is connected to the phase connection terminal 54c of the power module 48. The standing portions 77 are provided at both ends of the connection portion 75 in the width direction (the Y direction). The standing portions 77 stand from the connection portion 75 in the +Z direction. The standing portions 77 extend in the X direction. That is, the standing portions 77 extend along the connection portion 75. The phase connection terminal 54c corresponds to a second connection terminal of the present invention. The connection portion 75 corresponds to a second connection portion of the present invention. The standing portion 77 corresponds to a second standing portion of the present invention.

The protruding portions 78 protrude from the respective standing portions 77. The protruding portion 78 located on the +Y direction side of the connection portion 75 protrudes in the +Y direction from the standing portion 77. The protruding portion 78 located on the −Y direction side of the connection portion 75 protrudes in the −Y direction from the standing portion 77. As described above, the connection surface 52 of the power module 48 is substantially parallel to the Y direction. Therefore, the protruding portions 78 protrude along the connection surface 52 of the power module 48.

Figure 15:
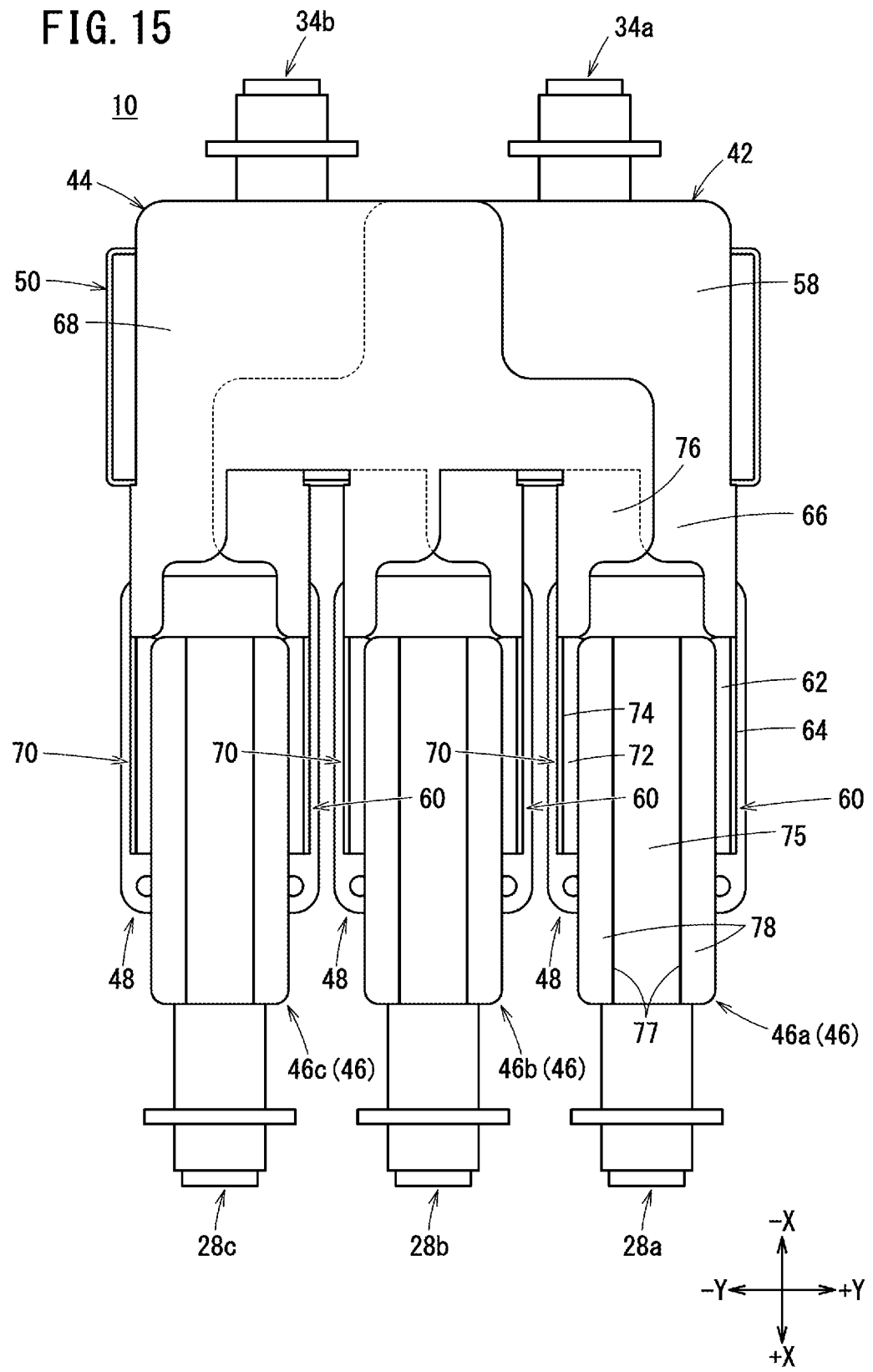
FIG. 15 is a plan view of the electric device.
Figure 16:
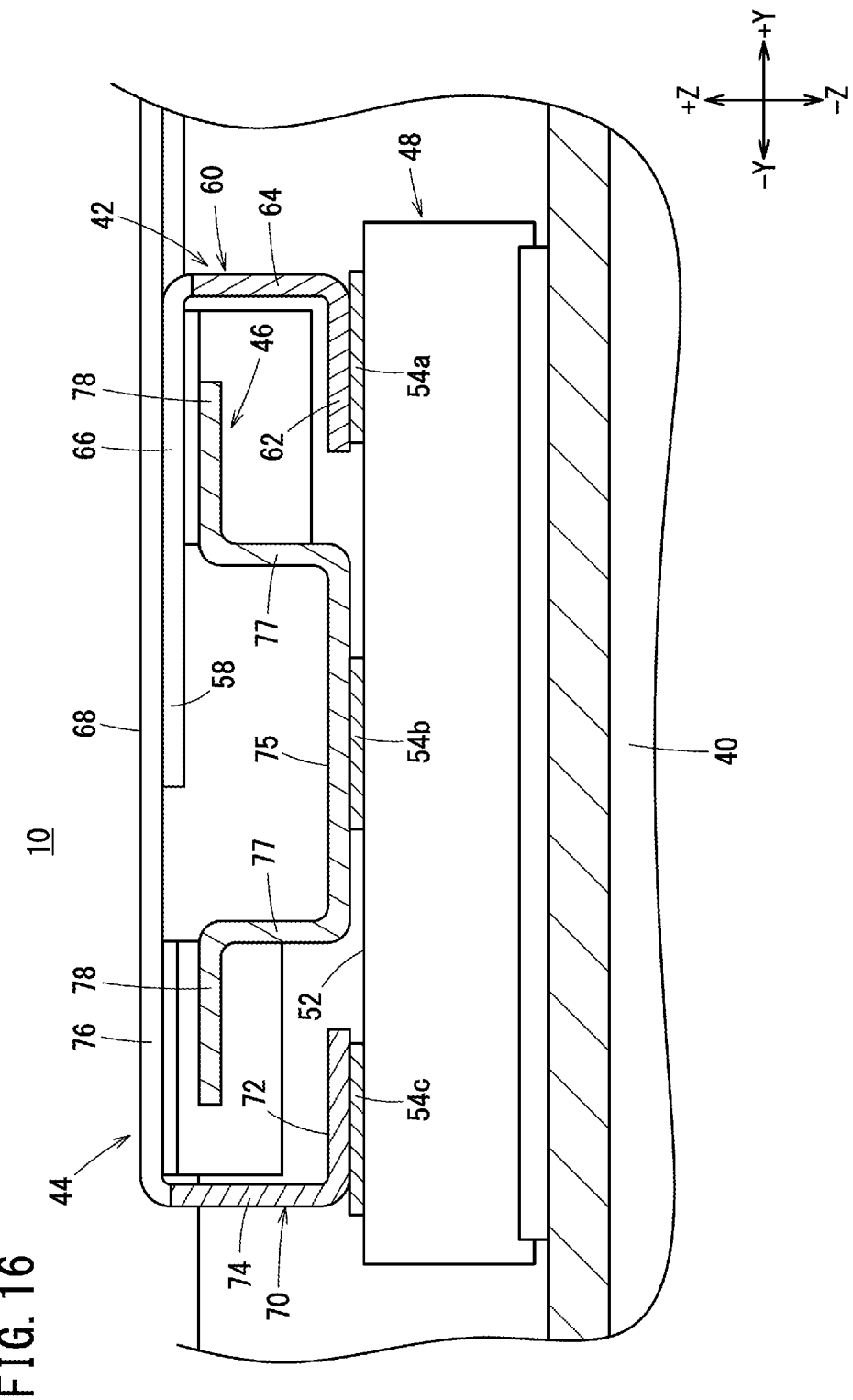
FIG. 16 is a cross-sectional view of the electric device.

FIG. 15 is a plan view of the PCU 10. FIG. 16 is a cross-sectional view of the PCU 10. FIGS. 15 and 16 show a state where the casing 36 is removed.

As shown in FIG. 15, the protruding portion 78 of the phase bus bar 46 overlaps the power module connection portion 62 of the positive bus bar 42 in a plan view. Further, the protruding portion 78 of the phase bus bar 46 overlaps the power module connection portion 72 of the negative bus bar 44 in a plan view. Note that the plan view indicates a view viewed from the Z direction.

As shown in FIG. 16, the protruding portion 78 of the phase bus bar 46 is spaced apart from the power module connection portion 62 of the positive bus bar 42 in a side view. Further, the protruding portion 78 of the phase bus bar 46 is spaced apart from the power module connection portion 72 of the negative bus bar 44 in a side view. Note that the side view indicates a view viewed from the X direction.

As shown in FIG. 15, the negative terminal connection portion 68 of the negative bus bar 44 overlaps the positive terminal connection portion 58 of the positive bus bar 42 in a plan view. As shown in FIG. 16, the negative terminal connection portion 68 of the negative bus bar 44 is spaced apart from the positive terminal connection portion 58 of the positive bus bar 42 in a side view. The distance between the positive terminal connection portion 58 and the negative terminal connection portion 68 is shorter than the distance between the protruding portion 78 of the phase bus bar 46 and the positive terminal connection portion 58 of the positive bus bar 42. The positive terminal connection portion 58 and the negative terminal connection portion 68 are located close to each other, whereby a function of a capacitor can be provided between the positive terminal connection portion 58 and the negative terminal connection portion 68.

As shown in FIG. 16, the thickness direction of the power module connection portion 62 of the positive bus bar 42 lies along the Z direction. Further, the thickness direction of the standing portion 64 of the positive bus bar 42 lies along the Y direction. Therefore, the thickness direction of the power module connection portion 62 of the positive bus bar 42 and the thickness direction of the standing portion 64 of the positive bus bar 42 intersect with each other.

As shown in FIG. 16, the thickness direction of the power module connection portion 72 of the negative bus bar 44 lies along the Z direction. Further, the thickness direction of the standing portion 74 of the negative bus bar 44 lies along the Y direction. Therefore, the thickness direction of the power module connection portion 72 of the negative bus bar 44 and the thickness direction of the standing portion 74 of the negative bus bar 44 intersect with each other.

As shown in FIG. 16, the thickness direction of the connection portion 75 of the phase bus bar 46 lies along the Z direction. Further, the thickness direction of the standing portion 77 of the phase bus bar 46 lies along the Y direction. Therefore, the thickness direction of the connection portion 75 of the phase bus bar 46 and the thickness direction of the standing portion 77 of the phase bus bar 46 intersect with each other.

As shown in FIG. 16, the power module 48 is located between the power module connection portion 62 of the positive bus bar 42 and the cooler 40. Further, the power module 48 is located between the power module connection portion 72 of the negative bus bar 44 and the cooler 40.

Advantageous Effects

In many cases, the designer of the PCU 10 cannot freely determine the configuration of the terminals and the like of the power module 48. While there are restrictions on the configuration of the terminals and the like of the power module 48, it is required to realize wiring arrangement with a small amount of heat generation, excellent cooling performance, and a small electrical loss, in consideration of the exchange of electricity with the outside of the PCU 10.

The widths of the bus bars provided in the PCU 10 are limited in order to prevent interference between the bus bar and the adjacent bus bar, and interference between the bus bar and the terminals of the adjacent power module 48. Further, the positive bus bar 42 and the negative bus bar 44 through which a direct current flows are required to have a small parasitic inductance.

The PCU 10 of the present embodiment includes the power modules 48 and the positive bus bar 42. The positive bus bar 42 is connected to the positive connection terminals 54*a* provided on the connection surfaces 52 of the power modules 48. The positive bus bar 42 includes the power module connection portions 62 and the standing portions 64. The power module connection portions 62 are connected to the positive connection terminals 54*a* of the power modules 48. The power module connection portions 62 extend in the X direction. The standing portions 64 stand from the respective power module connection portions 62. The standing portions 64 extend along the power module connection portions 62.

Since the positive bus bar 42 includes the standing portions 64, the width of the positive bus bar 42 can be ensured at locations where the positive bus bar 42 and the power modules 48 are connected. Therefore, the parasitic inductance of the positive bus bar 42 can be reduced. This makes it possible to suppress a voltage surge at the time of switching of the power modules 48, and to increase the switching speed. As a result, the switching loss is reduced, and the efficiency of the PCU 10 can be improved. In addition, the electrical resistance of the positive bus bar 42 can be reduced. This can reduce energy loss in the positive bus bar 42, and thus can increase the energy efficiency of the PCU 10. Further, the amount of heat generated in the positive bus bar 42 can be reduced, and the heat dissipation efficiency of the positive bus bar 42 can be increased. As a result, the allowable value of the current flowing through the positive bus bar 42 can be set to be large.

The PCU 10 of the present embodiment includes the negative bus bar 44. The negative bus bar 44 is connected to the negative connection terminals 54*b* provided on the connection surfaces 52 of the power modules 48. The negative bus bar 44 includes the power module connection portions 72 and the standing portions 74. The power module connection portions 72 are connected to the negative connection terminals 54*b* of the power modules 48. The power module connection portions 72 extend in the X direction. The standing portions 74 stand from the respective power module connection portions 72. The standing portions 74 extend along the power module connection portions 72.

Since the negative bus bar 44 includes the standing portions 74, the width of the negative bus bar 44 can be ensured at locations where the negative bus bar 44 and the power modules 48 are connected. Therefore, the parasitic inductance of the negative bus bar 44 can be reduced. This makes it possible to suppress a voltage surge at the time of switching of the power modules 48, and to increase the switching speed. As a result, the switching loss is reduced, and the efficiency of the PCU 10 can be improved. In addition, the electrical resistance of the negative bus bar 44 can be reduced. This can reduce energy loss in the negative bus bar 44, and thus can increase the energy efficiency of the PCU 10. Further, the amount of heat generated in the negative bus bar 44 can be reduced, and the heat dissipation efficiency of the negative bus bar 44 can be increased. As a result, the allowable value of the current flowing through the negative bus bar 44 can be set to be large.

The PCU 10 of the present embodiment includes the phase bus bars 46. The phase bus bars 46 are respectively connected to the phase connection terminals 54*c* provided on the connection surfaces 52 of the power modules 48. The phase bus bars 46 each include the connection portion 75 and the standing portions 77. The connection portions 75 are connected to the phase connection terminals 54*c* of the power modules 48. The connection portions 75 extend in the X direction. The standing portions 77 stand from the connection portion 75. The standing portions 77 extend along the connection portion 75.

Since the phase bus bars 46 each include the standing portions 77, the widths of the phase bus bars 46 can be ensured at locations where the phase bus bars 46 and the power modules 48 are connected. Therefore, the electrical resistance of the phase bus bars 46 can be reduced. This can reduce energy loss in the phase bus bars 46, and thus can increase the energy efficiency of the PCU 10. Further, the amount of heat generated in the phase bus bars 46 can be reduced, and the heat dissipation efficiency of the phase bus bars 46 can be increased. As a result, the allowable value of the current flowing through the phase bus bars 46 can be set to be large.

In the PCU 10 of the present embodiment, the phase bus bars 46 each include the protruding portions 78. The protruding portions 78 protrude from the respective standing portions 77 along the connection surface 52 of each power module 48. Since the phase bus bars 46 each include the protruding portions 78, the widths of the phase bus bars 46 can be ensured at locations where the phase bus bars 46 and the power modules 48 are connected. Therefore, the electrical resistance of the phase bus bars 46 can be reduced. This can reduce energy loss in the phase bus bars 46, and thus can increase the energy efficiency of the PCU 10. Further, the amount of heat generated in the phase bus bars 46 can be reduced, and the heat dissipation efficiency of the phase bus bars 46 can be increased. As a result, the allowable value of the current flowing through the phase bus bars 46 can be set to be large.

In the PCU 10 of the present embodiment, the protruding portion 78 of each phase bus bar 46 at least partially overlaps the power module connection portion 62 of the positive bus bar 42 in a plan view. Further, the protruding portion 78 of each phase bus bar 46 at least partially overlaps the power module connection portion 72 of the negative bus bar 44 in a plan view. This makes it possible to ensure the widths of the phase bus bars 46 while avoiding an increase in the size of the PCU 10.

The PCU 10 of the present embodiment includes the cooler 40 for cooling the power modules 48. Each power module 48 is located between the power module connection portion 62 of the positive bus bar 42 and the cooler 40. Further, each power module 48 is located between the power module connection portion 72 of the negative bus bar 44 and the cooler 40. The power module 48 having a large heat generation amount and the cooler 40 can be located close to each other, and thus the cooling efficiency of the power module 48 can be increased.

The following notes (appendices) are further disclosed in relation to the above-described embodiment.
(Appendix 1)
The electric device (10) includes: the electric component (48); and the first bus bar (42) connected to the first connection terminal (54*a*) disposed on the connection surface (52) provided on the electric component, wherein the first bus bar includes the first connection portion (62) connected to the first connection terminal and extending in the first direction, and the first standing portion (64) extending along the first connection portion and standing from the first connection portion. According to this feature, it possible to provide an electric device including a favorable bus bar.
(Appendix 2)

The electric device according to Appendix 1 may further include the second bus bar (46) connected to the second connection terminal that is disposed on the connection surface and is adjacent to the first connection terminal, and the second bus bar may include the second connection portion (75) connected to the second connection terminal and extending in the first direction, and the second standing portion (77) extending along the second connection portion and standing from the second connection portion. According to this feature, it possible to provide an electric device including favorable bus bars.
(Appendix 3)

In the electric device according to Appendix 2, the second bus bar may include the protruding portion (78) that protrudes along the connection surface from the second standing portion. According to this feature, it possible to provide an electric device including favorable bus bars.
(Appendix 4)

In the electric device according to Appendix 3, the protruding portion may at least partially overlap the first connection portion in a plan view. According to this feature, the size of the electric device can be reduced.
(Appendix 5)

The electric device according to Appendix 1 may further include the cooler (40) configured to cool the electric component, wherein the electric component may be located between the cooler and the first connection portion. According to this feature, the electric component can be efficiently cooled.
(Appendix 6)

In the electric device according to Appendix 5, the electric component may be a power conversion device including a switching element. According to this feature, the power conversion device can be efficiently cooled.
(Appendix 7)

The moving object (12) includes the electric device according to any one of Appendices 1 to 6. According to this feature, it is possible to provide a moving object provided with the electric device including favorable bus bars.

The present invention is not limited to the above disclosure, and various modifications are possible without departing from the essence and gist of the present invention.

In the above embodiment, the PCU 10 is mounted on the aircraft 12, but the present invention is not limited thereto. The PCU 10 may be mounted on various moving objects such as ships, automobiles, and trains.

The invention claimed is:

1. An electric device comprising:
an electric component; and
a first bus bar connected to a first connection terminal disposed on a connection surface provided on the electric component,
wherein
a longitudinal direction of the first connection terminal extends in a first direction,
the first bus bar includes a first connection portion connected to the first connection terminal, and a first standing portion standing from the first connection portion,
a length of the first connection portion in the first direction is equal to a length of the first connection terminal in the first direction, and a longitudinal direction of the first standing portion extends in the first direction, and a length of the first standing portion in the first direction is equal to the length of the first connection portion in the first direction.

2. The electric device according to claim 1, further comprising a second bus bar connected to a second connection terminal that is disposed on the connection surface and is adjacent to the first connection terminal, wherein
the second bus bar includes a second connection portion connected to the second connection terminal and extending in the first direction, and a second standing portion extending along the second connection portion and standing from the second connection portion.

3. The electric device according to claim 2, wherein
the second bus bar includes a protruding portion that protrudes along the connection surface from the second standing portion.

4. The electric device according to claim 3, wherein
the protruding portion at least partially overlaps the first connection portion in a plan view.

5. The electric device according to claim 1, further comprising a cooler configured to cool the electric component, wherein
the electric component is located between the cooler and the first connection portion.

6. The electric device according to claim 5, wherein
the electric component is a power conversion device including a switching element.

7. A moving object comprising the electric device according to claim 1.

8. The electric device according to claim 1, wherein
the first bus bar includes a capacitor connection portion connected to a connection terminal of a capacitor, and
the first standing portion and the capacitor connection portion do not overlap each other when the electric device is seen from the first direction.

9. The electric device according to claim 3, further comprising a third bus bar disposed on the connection surface and connected to a third connection terminal adjacent to the second connection terminal,
wherein
a longitudinal direction of the second connection terminal and a longitudinal direction of the third connection terminal extend in the first direction,
the third bus bar includes
a third connection portion connected to the third connection terminal, and
a third standing portion standing from the third connection portion,
a longitudinal direction of the third connection portion extends in the first direction, and a length of the third connection portion in the first direction is equal to a length of the third connection terminal in the first direction,
a longitudinal direction of the third standing portion extends in the first direction, and a length of the third standing portion in the first direction is equal to a length of the third connection portion in the first direction,
the second standing portion is provided at an end portion of the second connection portion toward the first connection terminal and at an end portion of the second connection portion toward the third connection terminal when the electric device is viewed from the first direction,
the protruding portion protruding from the second standing portion provided at the end of the second connection portion toward the first connection terminal protrudes toward the first connection terminal along the connection surface from the second standing portion, and the protruding portion protruding from the second standing portion provided at the end portion of the second connection portion toward the third connection terminal protrudes toward the third connection terminal along the connection surface from the second standing portion.

10. The electric device according to claim 3, wherein the protruding portion is disposed apart from the first connection portion when the electric device is viewed from the first direction.

11. The electric device according to claim 1, wherein the first connection terminal is provided on one end portion in the first direction of the first bus bar, and the first bus bar includes a capacitor connection portion so that a capacitor is connected between another end portion in the first direction of the first bus bar and the first connection terminal.

\* \* \* \* \*